(12) United States Patent
Perner

(10) Patent No.: US 7,057,201 B2
(45) Date of Patent: Jun. 6, 2006

(54) INTEGRATED SEMICONDUCTOR MEMORY

(75) Inventor: Martin Perner, München (DE)

(73) Assignee: Infineon Technologies AG, Munich (DE)

( * ) Notice: Subject to any disclaimer, the term of this patent is extended or adjusted under 35 U.S.C. 154(b) by 27 days.

(21) Appl. No.: 10/932,888

(22) Filed: Sep. 2, 2004

(65) Prior Publication Data

US 2005/0094461 A1 May 5, 2005

(30) Foreign Application Priority Data

Sep. 2, 2003 (DE) ................................ 103 40 405

(51) Int. Cl.
*H01L 47/00* (2006.01)
*H01L 29/04* (2006.01)

(52) U.S. Cl. ........................ 257/3; 257/E45.002; 257/2; 257/4

(58) Field of Classification Search ...................... None
See application file for complete search history.

(56) References Cited

U.S. PATENT DOCUMENTS

| | | | |
|---|---|---|---|
| 5,687,112 A | 11/1997 | Ovshinsky | |
| 5,761,115 A | 6/1998 | Kozicki et al. | |
| 5,825,046 A | 10/1998 | Czubatyj et al. | |
| 5,841,712 A | 11/1998 | Wendell et al. | |
| 5,883,826 A | 3/1999 | Wendell et al. | |
| 5,896,312 A | 4/1999 | Kozicki et al. | |
| 5,914,893 A | 6/1999 | Kozicki et al. | |
| 5,915,084 A | 6/1999 | Wendell | |
| 5,920,517 A | 7/1999 | Wendell | |
| 5,923,601 A | 7/1999 | Wendell | |
| 5,930,185 A | 7/1999 | Wendell | |
| 5,933,023 A | 8/1999 | Young | |
| 5,936,892 A | 8/1999 | Wendell | |
| 5,940,334 A | 8/1999 | Holst | |
| 5,959,467 A | 9/1999 | Nolan, III et al. | |
| 5,964,884 A | 10/1999 | Partovi et al. | |
| 5,999,039 A | 12/1999 | Holst et al. | |
| 6,018,253 A | 1/2000 | Wendell | |
| 6,046,621 A | 4/2000 | Crowley | |

(Continued)

FOREIGN PATENT DOCUMENTS

DE  101 14 280 A1  9/2002

(Continued)

OTHER PUBLICATIONS

Spall, E., Presentation to IEEE Electron Device Society, IEEE Electron Devices Meeting, Manassas, May 22, 2001.

*Primary Examiner*—Tu-Tu Ho
(74) *Attorney, Agent, or Firm*—Slater & Matsil, L.L.P.

(57) ABSTRACT

An integrated semiconductor memory (1) has a multiplicity of memory cells (Z) and first lines (10) and second lines (20) that can be used to actuate the memory cells (Z). The path of each of the first lines (10) contains a respective device (5) that permits actuation of memory cells exclusively in the region of first subsections (I) of the first lines (10). The devices (5) can be set such that they bring about only partial decoupling of the second subsections (II) of the first lines (10) from the slatter's first subsections (I), with memory cells either in the region of the first subsections (I) only or in the region of both subsections (I, II) being able to be actuated, depending on the choice of a relatively short or a relatively long access time to the memory cells. This allows subregions of the semiconductor memory to be used for power-saving and faster memory operation.

19 Claims, 6 Drawing Sheets

U.S. PATENT DOCUMENTS

| | | |
|---|---|---|
| 6,054,918 A | 4/2000 | Holst |
| 6,075,719 A | 6/2000 | Lowrey et al. |
| 6,084,796 A | 7/2000 | Kozicki et al. |
| 6,087,674 A | 7/2000 | Ovshinsky et al. |
| 6,111,794 A | 8/2000 | Holst |
| 6,127,880 A | 10/2000 | Holst et al. |
| 6,144,220 A | 11/2000 | Young |
| RE37,259 E | 7/2001 | Ovshinsky |
| 6,282,142 B1 * | 8/2001 | Miyawaki ............. 365/230.03 |
| 6,304,479 B1 | 10/2001 | Vollrath et al. |
| 6,307,768 B1 | 10/2001 | Zimmermann |
| 6,314,014 B1 | 11/2001 | Lowrey et al. |
| 6,418,049 B1 | 7/2002 | Kozicki et al. |
| 6,469,364 B1 | 10/2002 | Kozicki |
| 6,474,766 B1 | 11/2002 | Cooper |
| 6,487,106 B1 | 11/2002 | Kozicki |
| 6,522,594 B1 * | 2/2003 | Scheuerlein ................ 365/206 |
| 6,572,024 B1 | 6/2003 | Baldishweiler et al. |
| 6,608,773 B1 | 8/2003 | Lowrey et al. |
| 6,613,604 B1 | 9/2003 | Maimon et al. |
| 6,617,192 B1 | 9/2003 | Lowrey et al. |
| 6,635,914 B1 | 10/2003 | Kozicki et al. |
| 6,636,453 B1 | 10/2003 | Fischer et al. |
| 6,639,862 B1 | 10/2003 | Spirkl |
| 6,750,079 B1 | 6/2004 | Lowrey et al. |
| 2002/0017701 A1 | 2/2002 | Klersy et al. |
| 2002/0036931 A1 | 3/2002 | Lowrey et al. |
| 2002/0085405 A1 | 7/2002 | Mueller et al. |
| 2002/0159095 A1 | 10/2002 | Cooper |
| 2002/0190350 A1 | 12/2002 | Kozicki et al. |
| 2002/0195621 A1 | 12/2002 | Maimon |
| 2003/0035314 A1 | 2/2003 | Kozicki |
| 2003/0035315 A1 | 2/2003 | Kozicki |
| 2003/0048519 A1 | 3/2003 | Kozicki |
| 2003/0075778 A1 | 4/2003 | Klersy |
| 2003/0107105 A1 | 6/2003 | Kozicki |
| 2003/0122156 A1 | 7/2003 | Maimon |
| 2003/0137869 A1 | 7/2003 | Kozicki |
| 2003/0156447 A1 | 8/2003 | Kozicki |
| 2003/0209728 A1 | 11/2003 | Kozicki et al. |
| 2003/0209971 A1 | 11/2003 | Kozicki |
| 2003/0215978 A1 | 11/2003 | Maimon et al. |
| 2004/0038445 A1 | 2/2004 | Lowrey et al. |

FOREIGN PATENT DOCUMENTS

| | | |
|---|---|---|
| DE | 101 21 837 C1 | 12/2002 |
| WO | WO 97/40499 | 10/1997 |
| WO | WO 97/48032 | 12/1997 |
| WO | WO 98/10517 | 3/1998 |
| WO | WO 98/14947 | 4/1998 |
| WO | WO 99/54128 | 10/1999 |
| WO | WO 00/70620 | 11/2000 |
| WO | WO 00/79539 A1 | 12/2000 |
| WO | WO 01/45108 A1 | 6/2001 |
| WO | WO 02/01571 A2 | 1/2002 |
| WO | WO 02/09206 A1 | 1/2002 |
| WO | WO 02/054405 A2 | 7/2002 |
| WO | WO 02/054409 A2 | 7/2002 |

* cited by examiner ial memory having a multiplicity of memory cells and having first lines and second lines which can be used to actuate the memory cells, the path of the first lines containing a respective device which permits exclusive actuation of memory cells in the region of just a first subsection of the respective first line and electrically decouples a second subsection of the respective first line.

INTEGRATED SEMICONDUCTOR MEMORY

This application claims priority to German Patent Application 103 40 405.8, which was filed Sep. 2, 2003, and is incorporated herein by reference.

TECHNICAL FIELD

The invention relates to an integrated semiconductor memory having a multiplicity of memory cells and having first lines and second lines which can be used to actuate the memory cells, the path of the first lines containing a respective device which permits exclusive actuation of memory cells in the region of just a first subsection of the respective first line and electrically decouples a second subsection of the respective first line.

BACKGROUND

A semiconductor memory is taught in WO 02/054405 A2. The semiconductor memory disclosed therein has first lines (bit lines) whose line path incorporates transistors which are not selection transistors for memory cells but rather, as part of the bit line, are used for electrically disconnecting a subsection of the respective bit line, depending on the switching state, and hence shortening the bit line length electrically.

Such shortening of the bit line length by means of circuitry can be used to reduce the power consumption of the semiconductor circuit. Whenever a memory cell which is connected to a bit line (or to a word line) is read or refreshed, the charge stored in the memory cell, for example in its capacitor, is passed to the open bit line, which alters the slatter's electrical potential. The change in potential is read using a signal amplifier and is interpreted as a digital zero or one. Potential thresholds are stipulated, above or below which the respective digital data value is assigned to the potential, which has been read.

The greater the length of the bit line, the higher the charge that needs to be applied for storage in the memory cells, which charge is required for sufficiently reliable reading of the digital information. In this context, particularly in the case of volatile semiconductor memories, it should be remembered that the memory cells lose a portion of their charge after a short time, i.e., are continuously discharging, and therefore need to be refreshed at regular, sufficiently short intervals of time. Hence, when a memory cell connected to a bit line is read, only a portion of the originally stored charge is read. Refreshing, i.e., regularly reading and overwriting the memory cells, involves a larger quantity of charge being written back to the memory cell. These charge reversal operations, which respectively extend over one bit line, result in a power consumption which, particularly in the case of mobile appliances, which contain the semiconductor memories mentioned at the outset, shortens the period of use independent of the mains.

To lower the power consumption, it is possible, particularly in semiconductor memories for mobile appliances, to provide shorter bit lines or a combination of shorter and longer bit lines in a memory cell area; in this case, however, larger numbers of bit lines and therefore also more signal amplifiers are needed for the same number of memory cells, which increases the area taken up for each memory cell.

DE 101 14 280 A1 (corresponding U.S. Pat. No. 6,639, 862) proposes lowering the power consumption by reusing at least a portion of the quantity of charge transported when a bit line is read, in order to write a charge back to the memory cell during refreshing, for example. To this end, the quantity of charge which is read is buffer-stored. Although this practice reduces the power consumption, the access speed is limited, since it is respectively necessary to read a bit line of full length. In the semiconductor memory known from WO 02/054405 A2 (corresponding U.S. Patent Publication No. 2002/0085405), the transistors incorporated into the center of the bit lines can be used to shorten the bit line length. However, this requires the transistor to be switched beforehand, and this switching operation needs to be interposed between the storage and read operations customary in normal memory operation and therefore slows down memory operation, despite the lower power consumption.

A further drawback of the semiconductor memories described in WO 02/054405 A2 is that the devices or transistors for selectively accessing memory cells exclusively in the region of a shortened bit line half need to be operated at very high reverse voltages if they are intended to block at sufficiently high resistance for both bit values zero and one. A high reverse voltage is necessary because the potential values of 0 V and 1.8 V, for example, which are required for a digital zero and for a digital one are present on both sides of the neutral potential of, by way of example, 0.9 V. Since the transistor needs to be conductive in the off state, only normally on depletion-mode transistors (depletion MOSFETs) are suitable. If the high reverse voltages need to be avoided in order to reduce the power consumption, the devices for selectively actuating subsections need to be produced using combinations of pFET and nFET transistors (p-doped or n-doped field effect transistors); such a circuit takes up additional memory area, however.

Finally, the single transistor used for temporary shortening of the bit line also has an intrinsic capacitance representing an additional parasitic capacitance in addition to the bit line capacitance.

A further drawback is that if memory cells situated between the bit line transistors and the signal amplifiers are to be read only using half of the bit line length, then every change between a memory cell to be read on this side of a bit line transistor and a memory cell to be read on that side of a bit line transistor on the same bit line requires that the bit line transistor change over between the blocking state and the conductive state, i.e., changeover between half of the bit line length and the full bit line length, and vice versa. Hence, all access to a memory cell within the memory cell array first requires a check to determine whether the bit line in question can be shorted using the bit line transistor or has already been shortened.

SUMMARY OF THE INVENTION

In one aspect, the present invention provides an integrated semiconductor memory, which can access the memory cells even faster at low power consumption or whose power consumption is further reduced for the same speed of access to the memory cells. In addition, the preferred embodiment provides a semiconductor memory, which no longer requires a switching operation or other influence on the device between the first subsection and the second subsection of the respective first line. The state of this device should no longer need to be rechecked and possibly changed before each further data bit is read.

In the preferred embodiment of the invention the devices in the integrated semiconductor memory are able to be set such that they bring about only partial electrical decoupling of the second subsections from the first subsections of the first lines. The partial decoupling, without intervening changeover or other influence on the devices, permitting memory cells to be actuated either within a respective first, relatively short access time exclusively in the region of the first subsection of the first lines or within a respective second, relatively long access time in the region of the first subsections and also of the second subsections of the first lines.

The embodiments of the invention provide for the subsections of the first lines (which subsections are connected to one another by the devices) to be only partially electrically decoupled from one another and for there to be two different access times for actuating the memory cells, particularly their selection transistors, in this partially decoupled state, with the actuation, for example reading, overwriting or refreshing, with a first, relatively short access time involving the actuation of exclusively memory cells in the region of the first subsections of the first lines, whereas a second, relatively long access time can be used in order to actuate memory cells in the entire region both of the first subsections and of the second subsections. Aspects of the present invention make use of the fact that the charge propagation from a memory cell via a bit line or from a signal amplifier along the bit line to the memory cell is a dynamic operation in which an electrical potential difference migrates from the end of the bit line which is situated on the signal amplifier to the opposite end of the bit line or in the opposite direction, with the device for selectively actuating just the first subsection producing partial decoupling, i.e., partial reflection and partial transmission of the incident potential difference. The time profile for the overlaying of the two partial currents is technically exploited in line with the invention using different access times, for example as a result of different times between the transistor s opening and the assessment of the connected bit line using the signal amplifier, or vice versa, using two different times between the series-connection of a bit line to a potential prescribed by the signal amplifier and the closing of the connected, initially open memory cell.

In line with embodiments of the invention, the path of the bit line contains a device which brings about only partial decoupling, by way of example, of a second bit line half from a first bit line half or, more generally, of a second subsection from a first subsection of the entire bit line. Partial decouplings can be produced, by way of example, using passive components, for example using electrical resistors of suitable strength, which results in a potential difference between the two bit line halves or subsections. In the case of nonstatic currents, i.e., during a switching operation, the electrical potential along the bit line is dependent on location and time. In the case of an electrical resistor as a device for partially decoupling the two subsections from one another, the resistor s level or strength is chosen to be sufficiently high for a relatively short access time to be able to be used for reading exclusively memory cells in the region of the first subsections, the relatively short access time corresponding to the period for the signal propagation of electrical signals along the first subsection or exceeding this period even for the memory cell with the longest signal path along the first subsection. To access memory cells on both subsections, on the other hand, an access time is used that is longer than for the signal propagation between the signal amplifier and the memory cell furthest away from it over both subsections. The longer access time is thus sufficiently long for all connected memory cells for the purpose of forwarding signals between the respective memory cell and the signal amplifier, possibly through the device for selective actuation.

Hence, the only partial decoupling of the two subsections of the first lines by the element arranged between them is used to allow two different modes of operation, namely access to memory cells along the entire bit line or just along one bit line half. Changing from one mode of operation to the other does not require the element to be changed over between the bit line halves and is effected merely through the choice of access time for interrogating the memory cells. In this case, memory cells in the region of the line halves or line subsections situated closer to the signal amplifiers can be actuated using either the relatively short access time or the relatively long access time, depending on the mode of operation; which of these modes of operation is chosen in each case may vary on a case-by-case basis depending on the type of data that are to be stored or read. By way of example, the memory area covered by the first subsections of the first lines may be used as a cache memory in which frequently needed data are requested or stored using a reduced access time and also more frequently.

In all cases, the first access time, which is shortened in the first mode of operation as compared with conventional access times, for reading only along the first subsections results in memory operation being speeded up and in the power consumption being lowered. The semiconductor memory designed in accordance with the invention is therefore particularly suitable for semiconductor memories, which operate at radio frequency and are used in mobile appliances.

Preferably, provision is made for the device to have passive components, which are respectively arranged between the first subsection and the second subsection of the respective first lines. Passive components do not require an electrical switching operation in order to alter their state, if it can be changed. However, exclusively active components have been used to date for temporarily electrically shortening lines, for example bit lines, because the decision to actuate either just a portion of a bit line or the entire bit line seems to suggest a commitment to a respectively unambiguous switching state. In line with the invention, however, provision is made for only partial decoupling of the two subsections of the lines, for example the bit lines, and different access times are used to access either the subsections on both sides of the element or just the first subsection on this side of the element. When this time-dependent access mechanism is prescribed, the invention uses passive components, particularly resistors, in order to attain partial decoupling.

Preferably, provision is made for each device to be able to be changed over between a first state, in which the device permits access to memory cells either along the entire first line or just along the first subsection, depending on the choice of access time, and a second state, in which the device permits access to memory cells along a region of the first line, which is fixed regardless of a chosen access time. The first state is the state of partial decoupling of both subsections by the element between them. The nature of the second state of this element is such that the electrically usable region of the first lines is no longer dependent on the signal propagation time along the bit line and hence on the access times. By way of example, the second state of the element is chosen such that in all cases exclusively memory cells in the region of the first subsection of the first line can be actuated, which, in the case of an electrical resistor between the two subsections, is produced by a particularly high-value resistor. Equally, the nature of the second state of the element may be such that any desired memory cell in the region of the first or second subsection can be actuated regardless of the access time chosen; this embodiment is implemented using a low-value resistor in the case of a resistive element.

In one development, each device can be put into more than two states with different levels of conductivity and hence different levels of electrical coupling between the first subsection and the second subsection. In this development, it is possible to use a varistor, for example, a resistive element with an adjustable resistance level, in which, by way of example, it is possible to set a mean resistance value for the partial decoupling, while a relatively low resistance value and a relatively high resistance value can be set for using exclusively the first subsections or exclusively the entire first lines.

Preferably, the passive components are respectively formed from a resistive layer comprising a material whose electrical resistance can be altered through phase transformation. In particular, the material contains a chalcogenide compound which can be reversibly transferred from a crystalline phase to an amorphous phase by briefly raising the temperature. Chalcogenide compounds have recently been used to allow new mechanisms for storing digital information in memory cells. Chalcogenides, such as GeSbTe or, more generally, binary, ternary or quaternary compounds containing sulfur, selenium, tellurium, arsenic, antimony, gallium, indium or silver, can be transformed through temperature changes from a conductive, crystalline phase to an amorphous, highly resistive phase, and vice versa, the current/voltage characteristic exhibiting a hysteresis curve which can be used for storage. In line with embodiments of the invention, however, such a material is not used for storing a digital information item, but rather is used for setting different levels of resistance within the first lines, for example the bit lines. Accordingly, provision is preferably made for the chalcogenide compound to contain sulfur, selenium, tellurium, arsenic, antimony, gallium or indium. The respective material used may be transformed from the crystalline phase into a glassy, amorphous phase through shock melting, i.e., heating. If, on the other hand, the amorphous phase is annealed using uniform thermal annealing, i.e., by heating for a longer period, then the material returns to the crystalline state. In the case of the material $Ge_2Sb_2Te_5$, for example, this means that this material s resistance can be varied between 10 $\Omega$ and 10 000 $\Omega$. Melting can be carried out using a temperature above 600°C., for example, whereas for recrystallization it is possible to use a temperature of between 200 and 400°C., for example 300°C.; the length of time for which the heat acts may be in the range between 10 and 100 ns, for example.

Preferably, each device has a local heating element close to the resistive layer. This heating element may preferably be a respective heating resistor. In this context, each element for memory access on the basis of selected subsections has a first resistive element, in which the level of the electrical resistance determines the degree of electrical coupling between the first and second subsections of the first lines. It also has a second resistive element, which is used for briefly heating the first resistive element locally and whose heating time and heating temperature can be controlled.

Preferably, the region of the first subsections of the first lines contains redundant second lines, which can be used to actuate additional memory cells within the first access time, and the region of the second subsections contains redundant using lines which can be used to actuate additional memory cells within the second access time. Redundant lines, for example redundant word lines, are known and are used in semiconductor memories in order to restore the number of necessary intact memory cells when there are faulty memory cells. Such lines are arranged at one end of the bit lines, for example, and are enabled when required using programmable fuses. In the case of the inventive semiconductor memory, such redundant second lines are preferably arranged both in the region of the first subsections and of the second subsections of the first lines. Hence, the size of the memory area, which can be operated more quickly can also be maintained when there are faulty memory cells.

Preferably, the first subsections and the second subsections extend together over the entire length of the first bit lines.

In one development of the invention, the semiconductor memory has a plurality of devices along each first line for selectively actuating memory cells in the region of subsections of the respective first line, each device partially electrically decoupling two adjacent subsections of the respective first line such that memory cells can be actuated only on one side of the respective device or on both sides of the respective device, depending on the length of the access time chosen. In the case of this development, each bit line has a plurality of passive components, which connect a plurality of subsections of this line to one another. In the case of this development, subregions of different sizes in a semiconductor memory can be operated using access times which are shortened to different degrees and which correspond to the line section, which extends up to the respective element. By way of example, a cache memory at the end of the bit line close to the signal amplifier may be used for information, which is required very frequently and this is read and stored using a greatly reduced access time and greatly reduced power consumption. On the other hand, data which are required very rarely may be stored in a rear region of the bit line which is isolated from the remaining region of the bit line by the last element on this respective bit line, which element is furthest away from the signal amplifier.

The above development opens up the opportunity for further embodiments with regard to the combination of the coupling strengths of a plurality of elements along a bit line with one another. Preferably, for example, a respective arbitrary device from the plurality of devices on the respective first line can be switched to a high-resistance state and the remaining devices from the plurality of devices on the respective first line can be switched to a low-resistance state. In this context, the resistive element switched to high resistance stipulates the limit between the rapid access memory and the remaining memory area in physical terms. Equally, the plurality of resistive elements on the first line may be coordinated with one another in terms of the level of their resistance such that more complex modes of operation with three or more access times of different length may be used to address memory areas which are each of different size. For this, preferably three or more resistance values of different level may be set for each resistive element.

Preferably, the time duration of the first, relatively short access time and of the second, relatively long access time can be respectively stipulated by the time at which a prescribed electrical potential is reached at a measurement point on the first line. There is thus no need for any external prescribing of specific periods between the opening of the memory cells and the reading of the bit lines. When a particular respective threshold potential is reached at a measurement point on the bit line, the bit line potential is read by a signal amplifier.

Alternatively, the time difference between the duration of the first, relatively short access time and the duration of the second, relatively long access time can be stipulated in the form of a prescribed period. In this context, the first and second access times are prescribed independently of potential.

Preferably, the first lines are bit lines and the second are word lines. The bit lines, which are opened for the purpose of actuating a memory cell only after the word lines, are suitable both for reducing the access time and for lowering the power consumption. Alternatively, word lines may be shortened as first lines using the inventive elements.

Finally, the semiconductor memory is a volatile semiconductor memory, particularly a dynamic read/write memory.

BRIEF DESCRIPTION OF THE DRAWINGS

The invention is described below with reference to FIGS. 1 to 16, in which.

DETAILED DESCRIPTION OF ILLUSTRATIVE EMBODIMENTS

Figure 1:
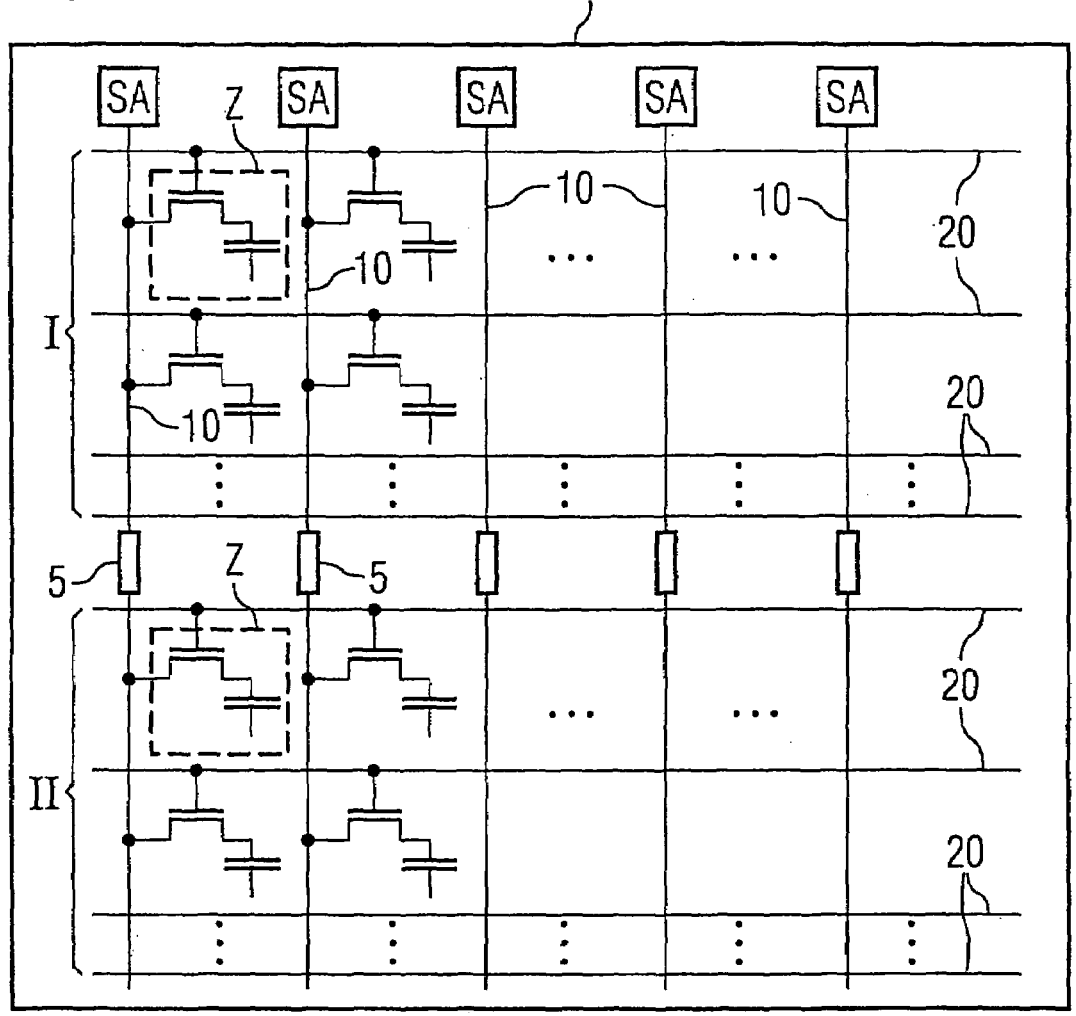
FIG. 1 shows a schematic plan view of a semiconductor memory based on the invention.

FIG. 1 shows an integrated semiconductor memory 1 based on the invention, whose cell array contains memory cells Z, which are connected to one another by bit lines 10 and word lines 20. The memory cells are, by way of example, cells in a volatile semiconductor memory, particularly in a DRAM (Dynamic Random Access Memory), in which case they each comprise a selection transistor and a storage capacitor. One end of the bit lines 10 is connected to a signal amplifier SA; in practice, a respective signal amplifier will connect two adjacent bit lines in order to be able to compare their electrical potentials with one another. The bit lines 10 are interrupted by elements 5 for selectively actuating memory cells exclusively in the region of first subsections I; on the other side of these elements 5, there are second subsections II of the bit lines 10. The memory area in the region of the subsections I serves as a power-saving rapid access memory which can be operated using bit line halves shortened by the elements 5.

Figure 2:
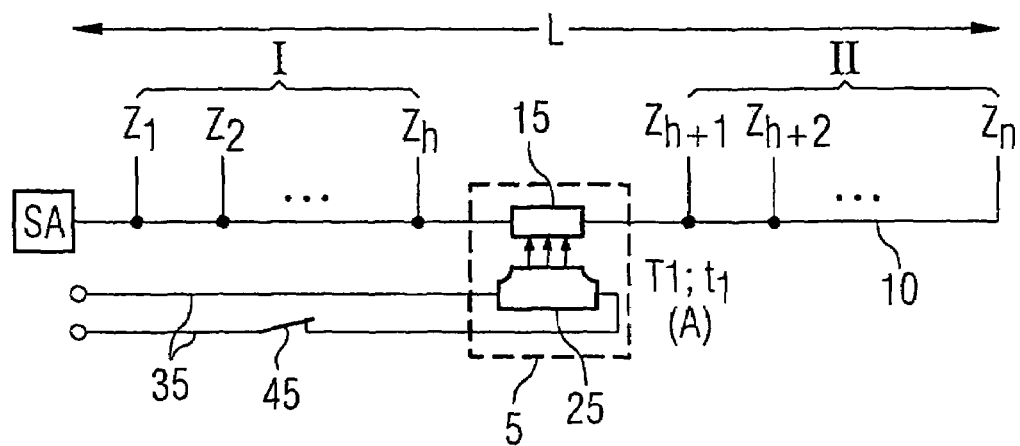
FIG. 2 shows a schematic cross-section from FIG. 1 along a bit line.

FIG. 2 shows a schematic cross-section for FIG. 1 along a bit line 10, along which memory cells Z1 to Zn coming from a signal amplifier SA are connected. The first subsection I of the bit line 10 comprises the memory cells Z1 to Zh; the second subsection II comprises the memory cells X (h+1) to Zn. Arranged in between is an element 5. The two subsections I, II extend together over the entire length L of the bit line 10.

In line with the invention, the element 5 can be set such that it brings about only partial electrical decoupling of the second subsection II from the first subsection I of the respective bit line 10. To this end, the element 5 in FIG. 2 contains a passive component, particularly a resistive layer 15, whose electrical resistance can be set, in one preferred embodiment, using a further, heating element 25. To this end, the heating element 25, a heating resistor, is connected to a heating current source by means of supply lines 35 and a switch 45, which is closed in FIG. 2. FIG. 2 shows the bit line 10, which is provided with the device 5 having the inventive design, in a first state A, which is characterized by a state of limited conductivity for the resistive layer 15. The limited conductivity is achieved by increasing the temperature of the resistive layer 5 to a temperature T1, which is reached by supplying heat in the direction shown by the arrow using the heating resistor 25.

Figure 3:
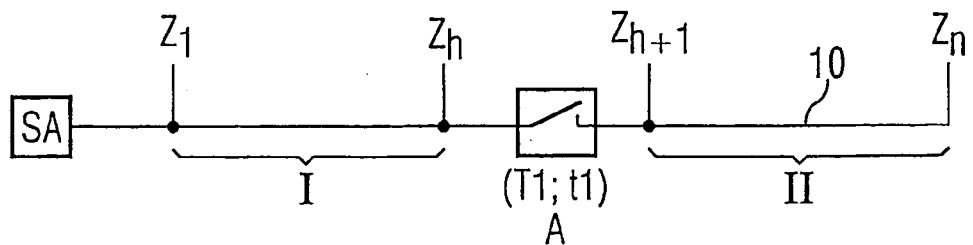
FIG. 3 shows a schematic illustration in line with FIG. 2 for a first state of the element between two subsections of the bit line in the case of a first access time.
Figure 4:
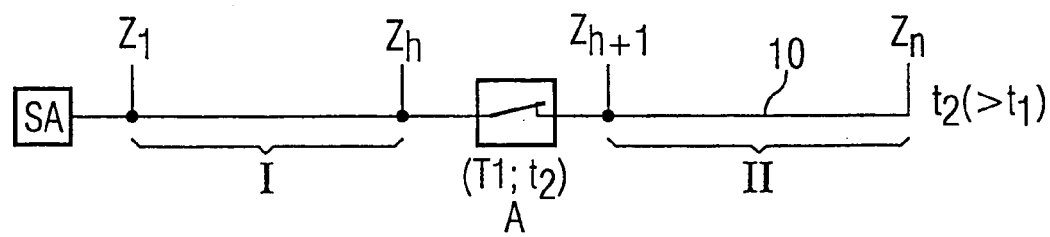
FIG. 4 shows a schematic illustration in line with FIG. 2 for a first state of the element between two subsections of the bit line in the case of a second access time.

FIGS. 3 and 4 show the electrical state of the resistive layer 15 in state A for the case of access times of different length t1 and t2. In line with FIG. 3, a first, comparatively short access time t1 is used to access the memory cells. By way of example, the time t1 is the time between the opening of a memory cell toward the bit line and the evaluation of the bit line potential by the signal amplifier SA. The time t1 is chosen to be of such short length that exclusively memory cells Z1 to Zh, in the region of the first subsection I are read and changes of potential at the left-hand bit line end are not affected by migrating voltage pulses in the region of the second subsection II. The resistive layer 15 or the element 5 thus corresponds to the open switch shown in FIG. 3. If, on the other hand, the access time is set to be long enough for signals to be able to propagate and distribute themselves along the full length L of the bit line 10, regardless of the position of the memory cells Z1 to Zn, then the element 5 operates in the manner of a closed switch, which is shown in FIG. 4, in the case of this second, relatively long access time t2. The potential profiles exploited in line with the invention will be explained below with reference to FIG. 9. Consequently, the inventive alteration of the access time results in partial decoupling of the second subsection II of the bit line 10 from the first subsection I, specifically in decoupling for the case of short access times t1 and coupling for the case of long access times t2.

Figure 5:
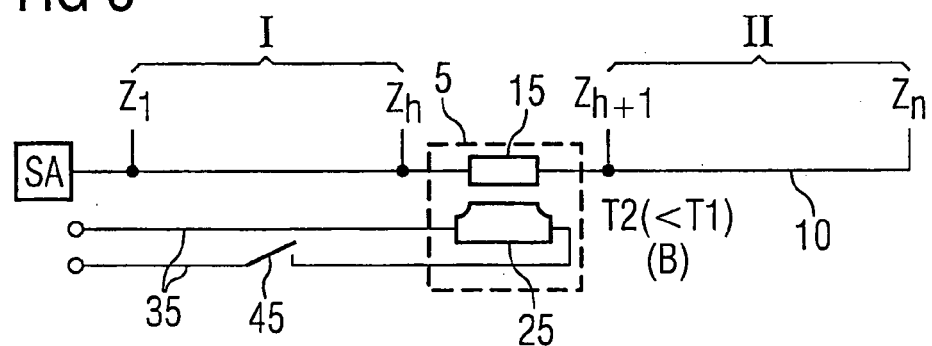
FIG. 5 shows a cross-section in line with FIG. 2 in a second state of the element between the first and second subsections of the bit line.
Figure 6:
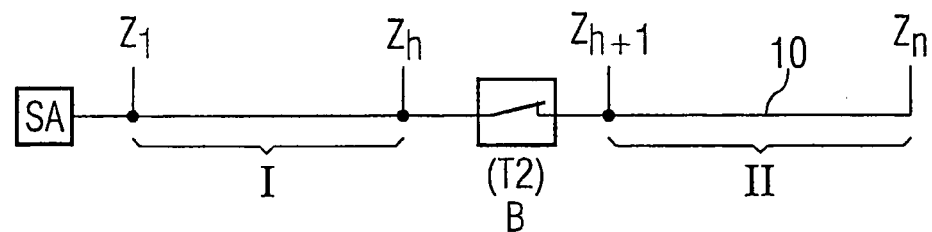
FIG. 6 shows a schematic illustration of the state of the element from FIG. 5.

FIG. 5 shows a memory cross-section based on FIG. 2 in line with an embodiment in which the element 5 between the two subsections I, II of the bit line 10 adopts a further state B. In this state B, the resistive layer 15 has been heated to a relatively low temperature T2, for example during a cooling operation from the temperature T1 with the heating circuit 35 interrupted, as indicated by the open switch 45. At this lower temperature T2, the resistive layer 15 has a low resistance and therefore represents a closed switch, as shown schematically in FIG. 6, which stipulates the entire length L as the bit line length which can be used electrically. Equally, the element 5 may (as is not shown in more detail) be put into a further state, in which the element 5 does not conduct, regardless of the access time chosen.

Figure 7:
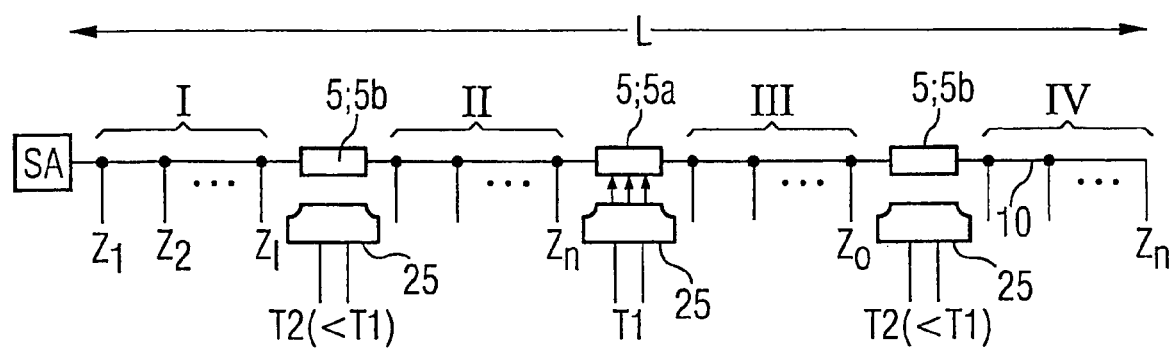
FIG. 7 shows a schematic illustration of an embodiment having a plurality of elements per bit line.

FIG. 7 shows a schematic cross-section through a developed embodiment of the invention in which each bit line 10 has been provided with a plurality of, for example three, elements 5 for the selective partial decoupling of the remaining quantity of bit lines, which are respectively situated on the right. Each element 5 comprises the resistive element (not denoted in more detail in FIG. 7) and a heating resistor 25 which can be heated, in each case individually, to different temperatures, for example T1 and T2, using a corresponding heating circuit. In particular, as in FIGS. 1 to 6, a binary, ternary or quaternary chalcogenide compound, which is crystalline or amorphous, i.e., has a low resistance or a high resistance, depending on the temperature, is used for the resistive layer. The elements 5 divide the bit line 10 into subsections I, II, III, IV along which a respective group of memory cells Z1 to Zp is connected.

Figure 8:
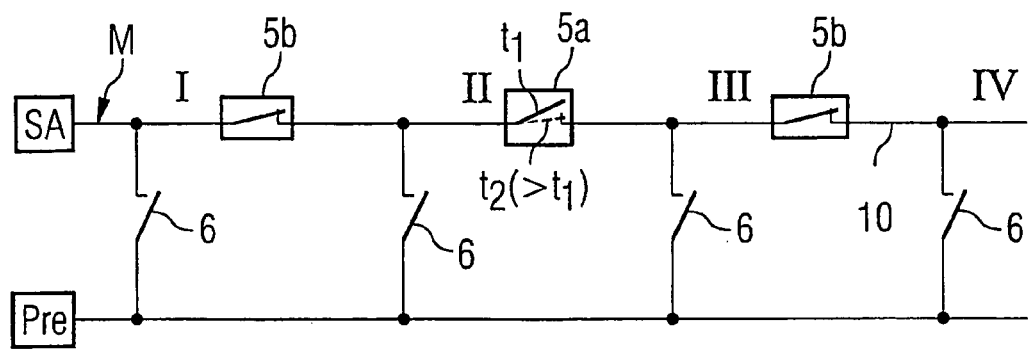
FIG. 8 shows a schematic circuit diagram for FIG. 7.

FIG. 8 shows a schematic diagram for FIG. 7 for the case in which only the middle element 5a is in the amorphous, high-resistance state. In this case, the bit line 10 between the subsections II and III is interrupted at this point, as illustrated by the open switch for the case of the relatively short access time t1. The two other elements 5b are briefly brought to a temperature T2 at which they then serve as closed switches, i.e., have a low resistance. Despite the comparatively high-resistance state of the middle element 5a, the choice of a relatively long access time t2 means that it is also possible to use the bit line in the region of the subsections III and IV, as before; the relatively long access time can access these subsections and hence the entire bit line 10, because it also takes into account the signal propagation time in these subsections, as explained below with reference to FIG. 9 for the case of just a single device 5 for actuating memory cells in specific subsections.

In addition, in FIG. 8 it is possible to bring all subsections of the bit line to a neutral potential, provided by a precharge connection, simultaneously via switches 6, to which end all of the switches 6 are closed. This means that all subsections can be brought to the neutral potential again at the same speed.

Figure 9:
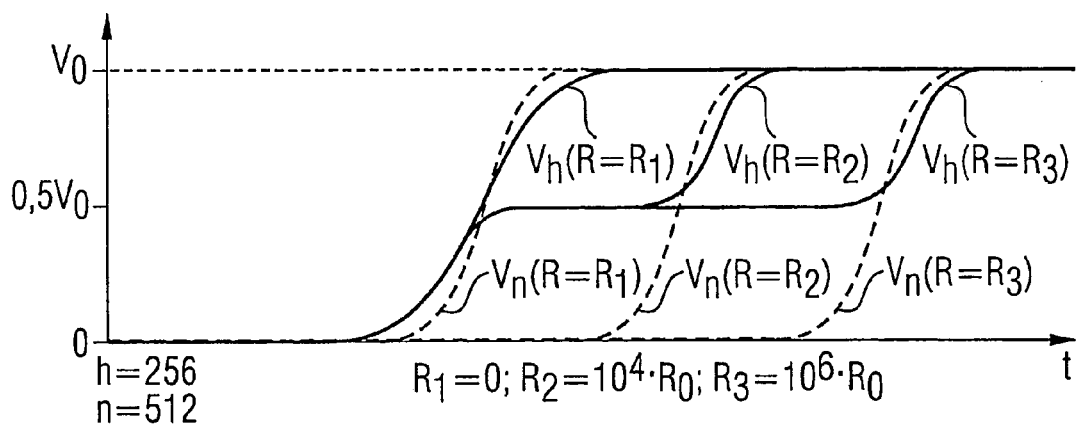
FIG. 9 shows the time profile for a change of potential along a bit line from FIG. 2 at different levels of resistance for the resistive element.

FIG. 9 shows the potential level, measured at the signal amplifier, as a function of the time t after a memory cell has been opened. When the entire charge in the memory cell is distributed evenly over this memory cell and over the entire bit line length, it rises from a relative neutral potential (for example 0.9 V) to a higher potential $V_0$. The rise to this potential takes place with a time delay, as illustrated by the left-hand curve Vn(R=R1) shown in dashes for the case of a bit line with n=512 connected memory cells when the last memory cell is read. In this case, the first assumption is that there is a very low-resistance element 5 between the subregions I, II. The voltage level measured on the signal amplifier upon reading the $256^{th}$ memory cell approximately in the center of the bit line (h=256) rises somewhat earlier, as can be seen from the curve Vh(R=R1), but ends later, since a portion of the voltage pulse first migrates to the opposite end of the bit line and is reflected from there. Forwarding of such a voltage pulse, which migrates to the bit line end and is reflected there, to the signal amplifier is delayed by a technically usable, sufficiently long time delay as soon as a passive component such as a resistor is connected between the two subregions I, II of the bit line. To this end, the resistance R2 or R3 is stipulated to be, by way of example, 10,000 times or 1,000,000 times the resistance R of the bit line per memory cell section. With these values, no significant changes are produced, apart from a time delay to the right, for the potential profiles shown in dashes when reading the respective last memory cell (n=512). On the other hand, when reading a memory cell which is arranged between the element 5 and the signal amplifier SA, for example for n=256, a first voltage swing to a half level 0.5 $V_0$ first takes place relatively early, and then the signal stagnates for a time and rises to the full potential $V_0$ at a later time. As the level of the electrical resistance of the element 5 increases, the length of time for the stagnation at the half level is extended, as can be seen from the curves shown by solid lines for the resistances R2 and R3 in comparison with one another.

Figure 10:
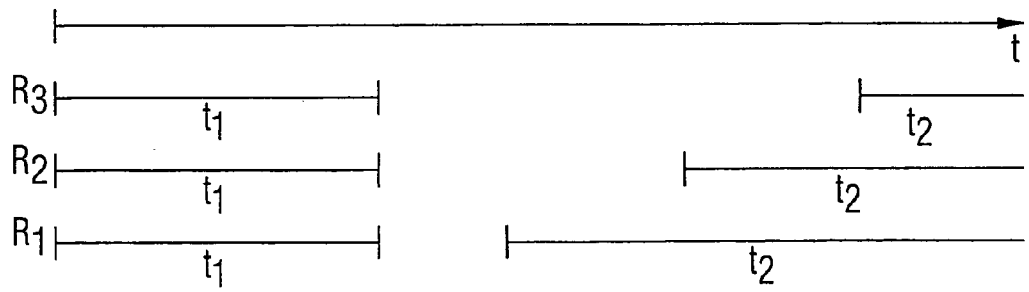
FIG. 10 shows a schematic illustration of possible extents for the first and second access times on the basis of FIG. 9.

FIG. 10 shows the extents of different access times t1 and t2, which can be exploited in view of the behavior shown in FIG. 9. As in FIG. 9, the time axis t should be interpreted in units relative to the time constant of a bit line section per memory cell; the bit line represents an RC element whose time constant can be regarded as a measure of time delays in bit line currents. At the disappearing resistance R1=0 Ω, the range of short access times t1 for accessing just the subsection I of the bit line is separated from the extent of relatively long access times t2 for accessing the entire memory area only by a short interval of time; the interlude corresponds approximately to the width of the rising edge in FIG. 9 in the case of the resistance R1. As can be seen in FIG. 10 for the increasing resistance R2 and R3, the time interval separating the two permitted access times t1, t2 increases to a significant extent when the electrical resistance R2, R3 of the element 5 between the two subsections I, II is increased, since the potential which is read on the signal amplifier SA stagnates at the half level of 0.5 $V_0$ over an increasingly longer period. The time interval separating the extents for the access times t1 and t2 is now so long that, regardless of the position of the various memory cells, which may vary from 1 to 512, for example, it is of sufficient length to allow reading using access times of different length.

Figure 11:
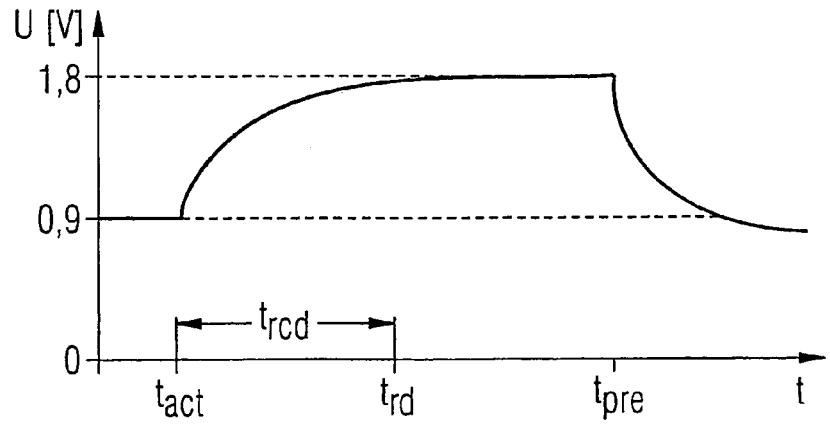
FIG. 11 shows the potential profile for a bit line after a memory cell has been opened.

FIG. 11 shows the potential profile for a bit line after a memory cell has been opened. At a first time $t_{act}$, the bit line is activated, i.e., is electrically connected to the stored charge in a memory cell. At a later time $t_{rd}$, the bit line is read. The period between these two times, the "RAS-CAS delay time" (row active strobe/column active strobe delay), is the access time which, in line with the invention, can be chosen differently in order to access the first subsections I or larger memory areas at different speeds. The delay time $t_{red}$ is also dependent on how quickly the charge which is read is distributed over the respective activated length of the bit line. Following the reading operation at the time $t_{rd}$, the bit line is biased to a neutral potential of 0.9 V, for example, again at a later time $t_{pre}$ so that a memory cell can be read again.

Figure 12:
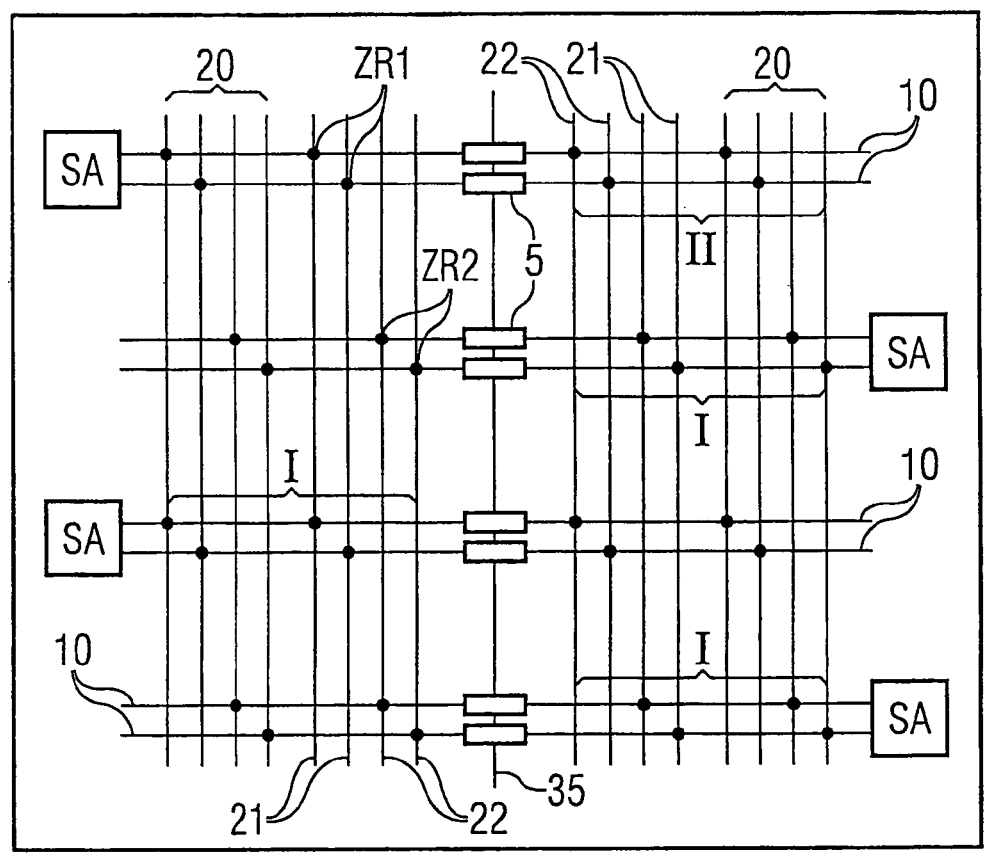
FIG. 12 shows a schematic plan view of a first embodiment of a semiconductor memory based on the invention.

FIG. 12 shows a schematic plan view of a semiconductor memory based on the invention which, besides word lines 20, also has redundant word lines 21 in the region of first subsections I and further redundant word lines 22 in the region of second subsections II of the bit lines 10. The devices 5 for actuating selected subsections, which are arranged in the center of these lines, are activated by a common heating line 35. Provided at points of intersection between the word lines 20, 21, 22 and the bit lines 10 are memory cells (indicated by circles), specifically redundant memory cells ZR1 in the region of the redundant word lines 21 and redundant memory cells ZR2 in the case of the redundant word lines 22. In FIG. 12, the signal amplifiers SA are arranged alternately on the left and right side of the devices 5, so that pairs of first and second subsections I, II run alternately on each side.

Figure 13:
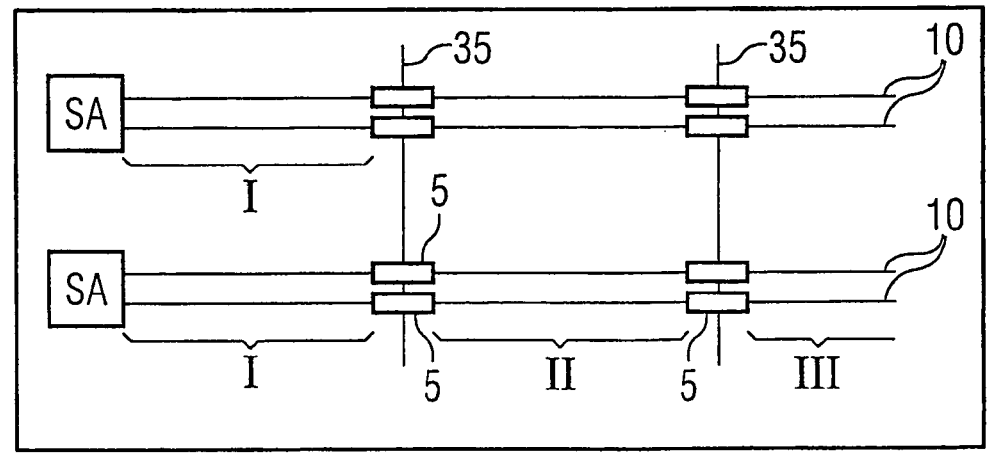
FIG. 13 shows a schematic plan view of a second embodiment of a semiconductor memory based on the invention.

FIG. 13 shows another embodiment of a semiconductor memory based on the invention, in which each bit line 10 is separated by two devices 5 for actuating memory cells in selected subsections. This isolates three subsections I, II, III, which can be used to actuate the memory cells (not shown in more detail) using access times of different length. Devices 5 arranged between the same subsections of the bit lines 10 are connected, inter alia, by a common heating line 35 and can be heated together and identically thereby.

Figure 14:
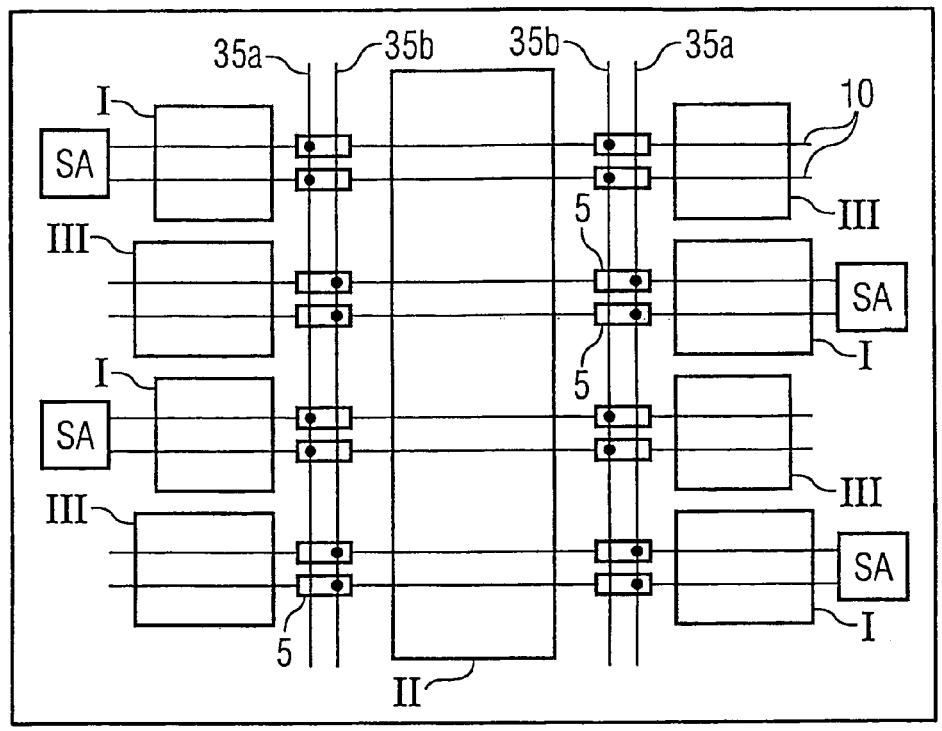
FIG. 14 shows a schematic plan view of a third embodiment of a semiconductor memory based on the invention.

FIG. 14 shows a further embodiment of a semiconductor memory based on the invention, in which the signal amplifiers are again arranged alternately on the left and right, but in this case there are likewise two devices 5 for actuating cells in selected subsections per bit line 10. In FIG. 14, each vertical row of devices 5 is provided with two heating lines 35a, 35b, the first 35a which is connected only to such devices 5 as are situated between a first subsection region I and a second subsection region II, whereas the respective second heating line 35b, as indicated by circular connections, is connected only to such devices 5 as are situated between a second subsection region II and a third subsection region III. In this way, signal amplifiers arranged alternately on the right and left may be combined with a plurality of devices 5 for actuating specific subsections for each bit line 10.

Figure 15:
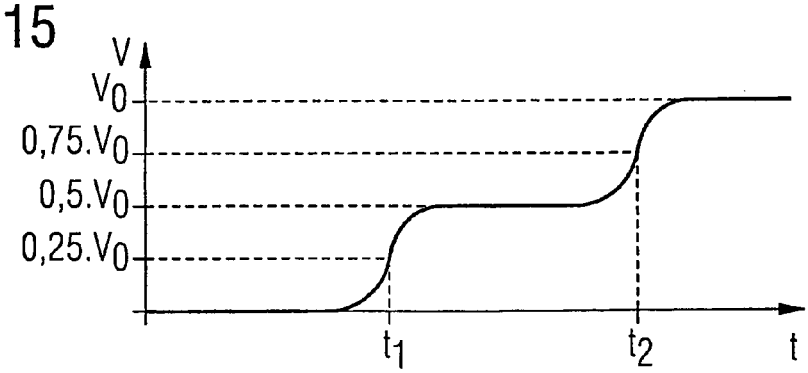
FIG. 15 shows a first embodiment for the choice of access times.

In line with FIG. 15, the length of the first, relatively short access time and of the second, relatively long access time is respectively stipulated by the time at which a prescribed electrical potential is reached at a particular point on the first line, for example when reaching 25 or 75 percent, more generally when reaching 10 to 40 or 60 to 90 percent for the first or second access time. In this context, there is no need for external prescribing of specific periods between the opening of the memory cells and the reading of the bit lines. When a particular respective threshold potential is reached at a measurement location M (FIG. 8) on the bit line, the bit line potential is read by a signal amplifier.

Figure 16:
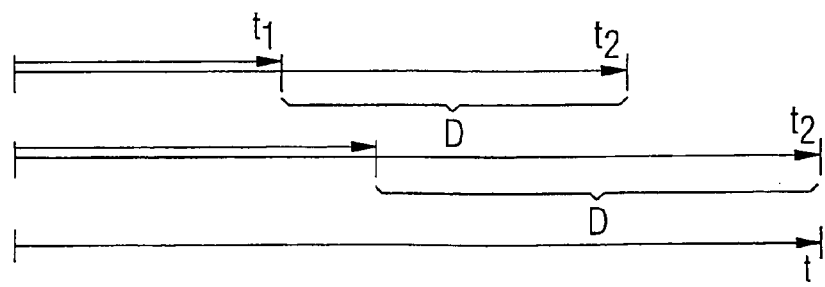
FIG. 16 shows a second embodiment for the choice of access times.

Alternatively, in line with FIG. 16, provision may be made for the time difference between the length of the first, relatively short access time t1 and the length of the second, relatively long access time t2 to be able to be stipulated in the form of a prescribed period D. In this context, the first and second access times are prescribed independently of potential externally outside the semiconductor memory or by a region of the semiconductor memory outside its memory cell array. It is thus possible to dispense with high time resolution measurement of the potential at the measurement location M. The level of the time difference D may be prescribed absolutely, for example, or in units of a cycle time.

The inventive cell actuation in specific subsections can be used to increase the access speed for accessing memory cells by several orders of magnitude.

LIST OF REFERENCE SYMBOLS

1 Semiconductor memory
5; 5a, 5b Device for cell actuation in specific subsections
6 Precharge switch
10 Bit line
15 Passive component
20 Word line
21, 22 Redundant word line
25 Heating element
35 Circuit
45 Switch
A, B States of the device 5
D Period of time
I First subsection
II Second subsection
III, IV Further subsections
M Measurement point
Pre Precharge connection
R Resistor
$R_0$ Bit line resistance per memory cell
R1, R2, R3 Resistances of the device 5
SA Signal amplifier
t Time axis
t1 First access time
t2 Second access time
$t_{act}$ Time of activation
$t_{pre}$ Time of deactivation
$t_{rd}$ Time of reading out
$t_{red}$ Access time
T1, T2 Temperatures
V Potential profile
$V_0$ Raised bit line potential
Z; Zl, Zh, Zn Memory cell

What is claimed is:

1. An integrated semiconductor memory comprising:
a plurality of memory cells;
first lines and second lines that can be used to actuate the memory cells; and
a plurality of devices, each device within a path of one of the first lines, the devices permitting exclusive actuation of memory cells in a region of just a first subsection of the first line and electrically decouples a second subsection of the respective first line, wherein the devices can be set in a state permitting, without intervening switching or other manipulating of the device, memory cells to be actuated either
within a respective first, relatively short access time exclusively in the region of the first subsection of the first lines; or alternatively
within a respective second, relatively long access time in the region of the first subsections and also of the second subsections of the first lines, depending on the respective access time chosen.

2. The semiconductor memory as claimed in claim 1, wherein each device can be put into more than two states with different levels of conductivity.

3. The semiconductor memory as claimed in claim 2, wherein the passive components are respectively formed from a resistive layer comprising a material whose electrical resistance can be altered through phase change.

4. The semiconductor memory as claimed in claim 3, wherein the material contains a chalcogenide compound.

5. The semiconductor memory as claimed in claim 4, wherein the chalcogenide compound, can be reversibly transferred from a crystalline phase to an amorphous phase by briefly raising the temperature.

6. The semiconductor memory as claimed in claim 5, wherein the chalcogenide compound comprises at least one material selected from the group consisting of sulfur, selenium, tellurium, arsenic, antimony, gallium and indium.

7. The semiconductor memory as claimed in claim 3, wherein each device includes a local heating element close to the resistive layer.

8. The semiconductor memory as claimed in claim 7, wherein the heating element is a respective heating resistor.

9. The semiconductor memory as claimed in claim 1, wherein the devices have passive components that are respectively arranged between the first subsection and the second subsection of the respective first line.

10. The semiconductor memory as claimed in claim 1, wherein each device can be switched between a first state in which the device permits access to memory cells either along the entire first line or just along the first subsection, depending on the choice of access time, and a second state, in which the device permits access to memory cells along a region of the first line which is fixed regardless of the access time chosen.

11. The semiconductor memory as claimed in claim 1, wherein the region of the first subsections of the first lines contains redundant second lines which can be used to actuate additional memory cells within the first access time, and wherein the region of the second subsections contains redundant second lines which can be used to actuate additional memory cells within the second access time.

12. The semiconductor memory as claimed in claim 1, wherein the first subsections and the second subsections extend together over the entire length of the first lines.

13. The semiconductor memory as claimed in claim 1, wherein the semiconductor memory has a plurality of devices along each first line for selectively actuating memory cells in the region of subsections of the respective first line, each device partially electrically decoupling two adjacent subsections of the respective first line such that memory cells can be actuated only on one side of the respective device or, alternatively, on both sides of the respective device, depending on the length of the respective access time chosen.

14. The semiconductor memory as claimed in claim 13, wherein any respective one of the devices of the plurality of devices on the respective first lines can be switched to a high-resistance state and the remaining devices from the plurality of devices on the respective first line can be switched to a low-resistance state.

15. The semiconductor memory as claimed in claim 1, wherein the time duration of the first, relatively short access time and of the second, relatively long access time can be respectively stipulated by the time at which a prescribed electrical potential is reached at a measurement point on the first line.

16. The semiconductor memory as claimed in claim 1, wherein the time difference between the duration of the first, relatively short access time and the duration of the second, relatively long access time can be stipulated in the form of a prescribed period of time.

17. The semiconductor memory as claimed in claim 1, wherein the first lines are bit lines and the second lines are word lines.

18. The semiconductor memory as claimed in claim 1, wherein the semiconductor memory is a volatile memory.

19. The semiconductor memory as claimed in claim 18, wherein the semiconductor memory comprises a dynamic read/write memory.

* * * * *